United States Patent [19]
Wada et al.

[11] Patent Number: 5,598,373
[45] Date of Patent: Jan. 28, 1997

[54] SEMICONDUCTOR MEMORY SYSTEM

[75] Inventors: Shoji Wada, Tokyo; Kanehide Kenmizaki, Kodaira; Masaya Muranaka, Akishima; Masahiro Ogata, Ohme; Hidetomo Aoyagi, Tachikawa; Tetsuya Kitame, Kodaira; Masahiro Katayama, Ohme; Shoji Kubono, Akishima; Yukihide Suzuki, Akishima; Makoto Morino, Akishima; Sinichi Miyatake, Hamura; Seiichi Shundo, Hatoyama-machi; Yoshihisa Koyama, Hamura; Nobuhiko Ohno, Tokorozawa, all of Japan

[73] Assignees: Hitachi, Ltd.; Hitachi ULSI Engineering Corp., both of Tokyo, Japan

[21] Appl. No.: 476,765

[22] Filed: Jun. 7, 1995

[30]     Foreign Application Priority Data

Jun. 29, 1994   [JP]   Japan .................................. 6-170207

[51] Int. Cl.$^6$ .............................. G11C 7/00; G11C 8/00; G11C 11/34; G11C 29/00
[52] U.S. Cl. .............................. 365/230.03; 365/185.09; 365/189.07; 365/200; 371/10.3
[58] Field of Search ........................ 365/230.03, 230.08, 365/185.09, 189.05, 189.07, 200; 371/10.3

[56]              References Cited

U.S. PATENT DOCUMENTS

4,628,509  12/1986  Kawaguchi ............................ 371/10.3

*Primary Examiner*—David C. Nelms
*Assistant Examiner*—Trong Phan
*Attorney, Agent, or Firm*—Antonelli, Terry, Stout & Kraus, LLP

[57]              ABSTRACT

A defect remedy LSI mounted on a memory module, comprising: an input interface portion for capturing address and control signals, the input interface portion being the same as that of a dynamic RAM; an input/output interface portion corresponding to a data bus of a memory device comprised of a plurality of dynamic random access memories; a memory circuit to which a chip address and an X defective address of any of the plurality of random access memories are electrically written, the memory circuit being substantially made nonvolatile; a redundancy remedy RAM portion composed of a static RAM wherein a word line is selected by a compare match signal between an X address signal and the defective address of the memory circuit, the X address signal and the defective address being captured via the input interface portion, and a column is selected by a Y address signal captured via the input interface portion; a selecting portion for connecting a data input/output bus of the redundancy remedy RAM portion to an input/output circuit corresponding to a defective chip address; a data input/output portion for selectively activating an input/output circuit to be connected to a data bus corresponding to a dynamic RAM found defective; and a mask portion for outputting a control signal for putting in a high-impedance state an output pin of the defective RAM in a read operation.

8 Claims, 7 Drawing Sheets

SEMICONDUCTOR MEMORY SYSTEM

BACKGROUND OF THE INVENTION

The present invention relates to a defect remedy LSI (Large Scale Integration) chip and a memory module and, more particularly, to a technique for remedying a defect of a RAM (Random Access Memory) module based on a dynamic RAM chip.

A defect remedy technique is known in which a redundant circuit is provided on a semiconductor chip to replace a defective word line or bit line with a word line or bit line of the redundant circuit. Another technique is also known in which a defective memory mat or memory array is put in an unused state by externally making address change to provide a semiconductor memory by combining sound parts.

SUMMARY OF THE INVENTION

However, in the above-mentioned conventional techniques, there is no consideration for remedying a dynamic RAM chip mounted on a mounting package. Therefore, if a defect is detected on a mounted dynamic RAM, an entire memory module containing the defective dynamic RAM becomes defective. To solve this problem, a memory module having a plurality of dynamic RAMs mounted on a single mounting package is constituted such that a defect detected after assembly is remedied to enhance the reliability of the memory module.

It is therefore an object of the present invention to provide a defect remedy LSI for remedying a defect detected on a dynamic RAM mounted on a mounting package.

It is another object of the present invention to provide a memory module for remedying a defect detected on a dynamic RAM after assembly.

The above and other objects, features and advantages of the present invention will become more apparent from the accompanying drawings, in which like reference numerals are used to identify the same or similar parts in several views.

In carrying out the invention and according to one aspect thereof, there is provided a semiconductor memory system having a defect remedy large-scale integrated circuit, the large-scale integrated circuit comprising: an input interface portion for capturing address and control signals, the input interface portion being the same as that of a dynamic RAM; an input/output interface portion corresponding to a data bus of a memory device comprised of a plurality of dynamic random access memories; a memory circuit to which a chip address and an X defective address of any of the plurality of random access memories are electrically written, the memory circuit being substantially made nonvolatile; a redundancy remedy RAM portion composed of a static RAM wherein a word line is selected by a compare match signal between an X address signal and the defective address of the memory circuit, the X address signal and the defective address being captured via the input interface portion, and a column is selected by a Y address signal captured via the input interface portion; a selecting portion for connecting a data input/output bus of the redundancy remedy RAM portion to an input/output circuit corresponding to a defective chip address; a data input/output portion for selectively activating an input/output circuit to be connected to a data bus corresponding to a dynamic RAM found defective; and a mask portion for outputting a control signal for putting in a high-impedance state an output pin of the defective RAM in a read operation.

According to this novel setup, mounting the above-mentioned defect remedy LSI chip on the memory module may remedy a defect caused on a word line basis in a dynamic RAM of the memory module by replacing the defective word line with the corresponding word line in the redundancy RAM internal to the defect remedy LSI chip.

DETAILED DESCRIPTION OF PREFERRED EMBODIMENTS

This invention will be described in further detail by way of example with reference to the accompanying drawings.

Figure 1:
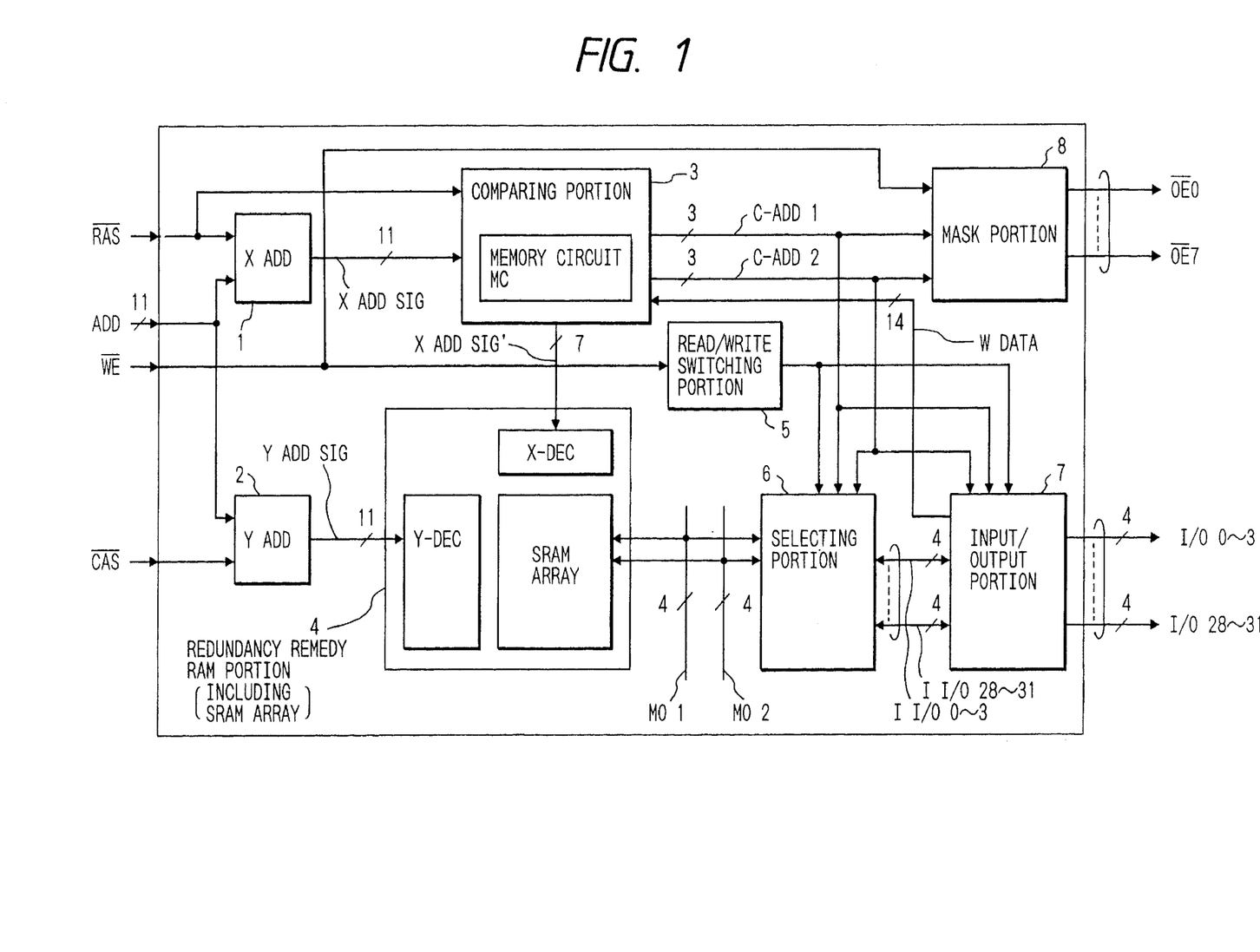
FIG. 1 is a block diagram illustrating a defect remedy LSI practiced as one preferred embodiment of the invention.

Now referring to FIG. 1, there is shown a defect remedy LSI chip practiced as one preferred embodiment of the present invention. Each of circuit blocks of FIG. 1 is formed on a single semiconductor substrate such as a single silicon crystal by means of known semiconductor integrated circuit fabrication techniques.

An X address buffer X-add 1 and a Y address buffer Y-add 2 have the same constitution as that of an X address buffer and Y address buffer of a dynamic RAM chip constituting a memory module along with the defect remedy LSI chip. For example, the defect remedy LSI chip and one or more dynamic RAMs are mounted on a same memory module. Namely, the X address buffer 1 captures an X address signal in synchronization with a row address strobe signal /RAS that is used commonly by the dynamic RAM. The Y address buffer 2 captures a Y address signal in synchronization with a column address strobe signal /CAS that is used commonly by the dynamic RAM. It should be noted that a slash (/) preceding each of the above-mentioned signal symbols denotes an active low signal and is represented in a bar over a corresponding signal in the figure. This holds true with other signals in the above-mentioned figure and other figures.

An X address comparing portion 3 has a memory circuit for storing a defective address and a comparing circuit for comparing an entered X address signal with the stored defective address, but not limited thereto. To implement the storing and comparing capabilities with simple constitutions and, at the same time, enable simple writing of a defective address on a memory module substrate (a mounting package) on which the implementations are mounted, the comparing portion 3 is formed by a memory circuit composed of a nonvolatile memory device. Namely, the memory circuit constituting the comparing portion 3 stores information by an amount of electrons stored in a floating gate of a nonvolatile memory device having a control gate and the floating gate like an EPROM (Erasable and Programmable Read-Only Memory) or flash EPROM device.

In a first defective address writing method, a plurality of dynamic RAM chips and a defect remedy LSI chip are mounted on the substrate of a memory module (or memory system) and then the memory module is inspected; if a defect is detected in a memory cell in any of the plurality of dynamic RAM chips, an address of the detected defective memory cell is written to a memory circuit of the defect remedy LSI chip with this chip mounted on the memory module. In addition to the first method, a second method is possible in which only the plurality of dynamic RAM chips are mounted on the substrate of the memory module and then the memory module is inspected; if a defect is detected in a memory cell in any of the plurality of dynamic RAM chips, an address of the detected defective memory cell is written to the memory circuit of defect remedy LSI chip with this chip removed from the memory module, which is mounted later on the memory module substrate. According to the second method, if no defect is found on the dynamic RAMs, there is no need for the defect remedy LSI to be mounted on the memory module substrate, resulting in a reduced cost of the memory module. Further, if the memory circuit is based on an EPROM for example, a write operation requires a relatively high voltage Vpp of about 12 V for example, the above-mentioned first method requires to provide a high-voltage wiring for the memory module. On the other hand, it is apparent that the second method does not require such a wiring because the write operation is performed outside the memory module. As a result, a packaging efficiency of the memory module is enhanced. In addition, a third method is possible in which a defective address of a memory found failing by a usual memory test is detected and stored, the defective address data is controlled as memory-unique data, defective memories are combined, and a remedy LSI written with defective addresses according to the defective memories is mounted on the memory module.

The memory circuit MC constituting the above-mentioned comparing portion (address converter) 3 is accessed by an X address signal "X-add sig" to be written with redundancy data containing a 3-bit first defective chip address C-add 1, a 3-bit second defective chip address C-add 2, a 1-bit remedy flag, and an X address "X-add sig" of a redundancy remedy RAM portion 4 for use in replacing a defective word line. Then, the above-mentioned defect data corresponding to the X address signal "X-add sig" entered by the memory access operation is read. If the above-mentioned remedy flag among the defect data is found valid, the read X address signal "X-add sig$^+$" for the redundancy remedy RAM portion 4 is supplied to an X-address selector X-dec of the redundancy remedy RAM portion 4. The redundancy remedy RAM portion 4 is constituted by static RAMs, in which a word line is selected by the X address signal for the redundancy remedy RAM portion "X-add sig$^+$" outputted from the comparing portion 3 and a Y-address select operation is performed by a Y selector Y-dec based on a Y address signal "Y-add sig" captured in the Y address buffer 2. The comparing portion 3 is supplied with the /RAS signal but not limited thereto. A read operation is determined valid when the /RAS signal is active, based on which the comparing portion performs the operation synchronized with an operation of the dynamic RAM.

From the redundancy remedy RAM portion 4, 8-bit redundancy remedy data is read by means of the X address selector X-dec for receiving the X address signal "X-add sig" for the redundancy remedy RAM portion and the Y address selector Y-dec for receiving the Y address signal "Y-add sig". The redundancy remedy data consists of 4-bit first redundancy remedy data "red data 1" and a 4-bit second redundancy remedy data "red data 2". A capacity of redundancy memory cells contained in the redundancy remedy RAM portion 4 is ($2^n \times 2^m \times 8$) bits. It should be noted that n denotes the number of bits (address signals) of the X address signal "X-add sig$^+$" for the redundancy remedy RAM portion and m denotes the number of bits (address signals) of the Y address signal "Y-add sig". In addition, $2^n$ is also said to be the total number of word lines of a dynamic RAM chip that can be remedied by the redundancy remedy RAM portion. To be more specific, given n=7 and m=11 for example, then the capacity of the memory cells is $2^7 \times 2^{11} \times 8 = 2$ megabits, thus constituting the redundancy RAM portion 4 by a very small memory capacity as compared with the dynamic RAM chip that is 16 megabits in capacity for example.

The above-mentioned 4-bit first redundancy remedy data "red data 1" is outputted to a 4-bit first input/output data bus MO1 and the 4-bit second redundancy remedy data "red data 2" is outputted to a 4-bit second input/output data bus MO2.

If a write enable signal /WE is low, a read/write switching portion 5 determines a write operation; if the write enable signal /WE is high, the read/write switching portion 5 determines a read operation, thereby controlling the signal transmission directions of a selecting portion 6 and an input/output portion 7.

The selecting portion 6 is coupled to the redundancy remedy RAM portion 4 via the first input/output data bus MO1 and the second input/output data bus MO2. The selecting portion 6 is also coupled to the input/output portion 7 via data buses of 32 bits in total of first internal data bus I-I/O 0–3 through eighth internal data bus I-I/O 28–31.

The input/output portion 7 is coupled to the total of 32 bits of the first data bus I/O 0–3 on the memory module through the eighth data bus I/O 28–31. The input/output portion 7 and the selecting portion 6 receive a first defective chip address C-add 1 and a second defective chip address C-add 2 from the comparing portion 3.

Based on the first defective chip address C-add 1, the selecting portion 6 connects predetermined internal buses I-I/O 4i–4i+3 (i=0, ..., 7) of the first internal data bus I-I/O 0–3 through the eighth internal data bus I-I/O 28–31 to the first input/output data bus MO1. Based on the second defective chip address C-add 2, the selecting portion 6 connects predetermined internal data buses I-I/O 4j–4j+3 (j=0, ..., 7) of the first internal data bus I-I/O 0–3 through the eighth internal data bus I-I/O 28–31 to the second input/output data bus MO2.

The input/output portion 7 has a capability of connecting, based on the first defective chip address C-add 1, the predetermined internal data buses I-I/O 4i–4i+3 (i=0, ..., 7) of the first internal data bus I-I/O 0–3 through the eighth internal data bus I-I/O 28~31 to corresponding predetermined data buses I/O 4i~4i+3 (i=0, ..., 7) of the first data bus I/O 0~3 through the eighth data bus I/O 28~31 of the memory module. Also, the input/output portion 7 has a capability of connecting, based on the second defective chip address C-add 2, predetermined internal data bases I-I/O 4j~4j+3 (j=0, ..., 7) of the first internal data bus I-I/O 0~3 through the eighth internal data bus I-I/O 28~31 to corresponding predetermined internal data buses I/O 4j~4j+3 (j=0, ..., 7) of the first data bus I/O 0~3 through the eighth data bus I/O 28~31 of the memory module.

The input/output portion 7 has a (k-1)th unit input/output circuit Dout/Din k-1 (k=1, ..., 8) connected between k-th internal bus I-I/O 4k~4k−1 (k=1, ..., 8) and k-th data bus I/O 4k4~4k−1 (k=1, ..., 8). In addition, the input/output portion 7 has an input/output decoder "I/O dec" that receives the first defective chip address C-add 1 and the second defective chip address C-add 2 to control the conductivity state of a 0-th unit input/output circuit "Dout/Din 0" through a 7th unit input/output circuit "Dout/Din 7".

A mask portion 8 forms output enable signals /OE 0~7 for putting in the high impedance state an output circuit of a dynamic RAM based on the first defective chip address C-add 1 and the second defective chip address C-add 2 coming from the comparing portion 3. If the dynamic RAM has no output enable pin /OE, the dynamic RAM may use the /RAS signal. Namely, the high impedance state may be formed by putting the /RAS of the defective dynamic RAM in the high level state and to put the dynamic RAM in the deselected state. To implement such a setup, the /RAS signal is supplied to each dynamic RAM on the memory module via the defect remedy LSI associated with the present invention.

Figure 2:
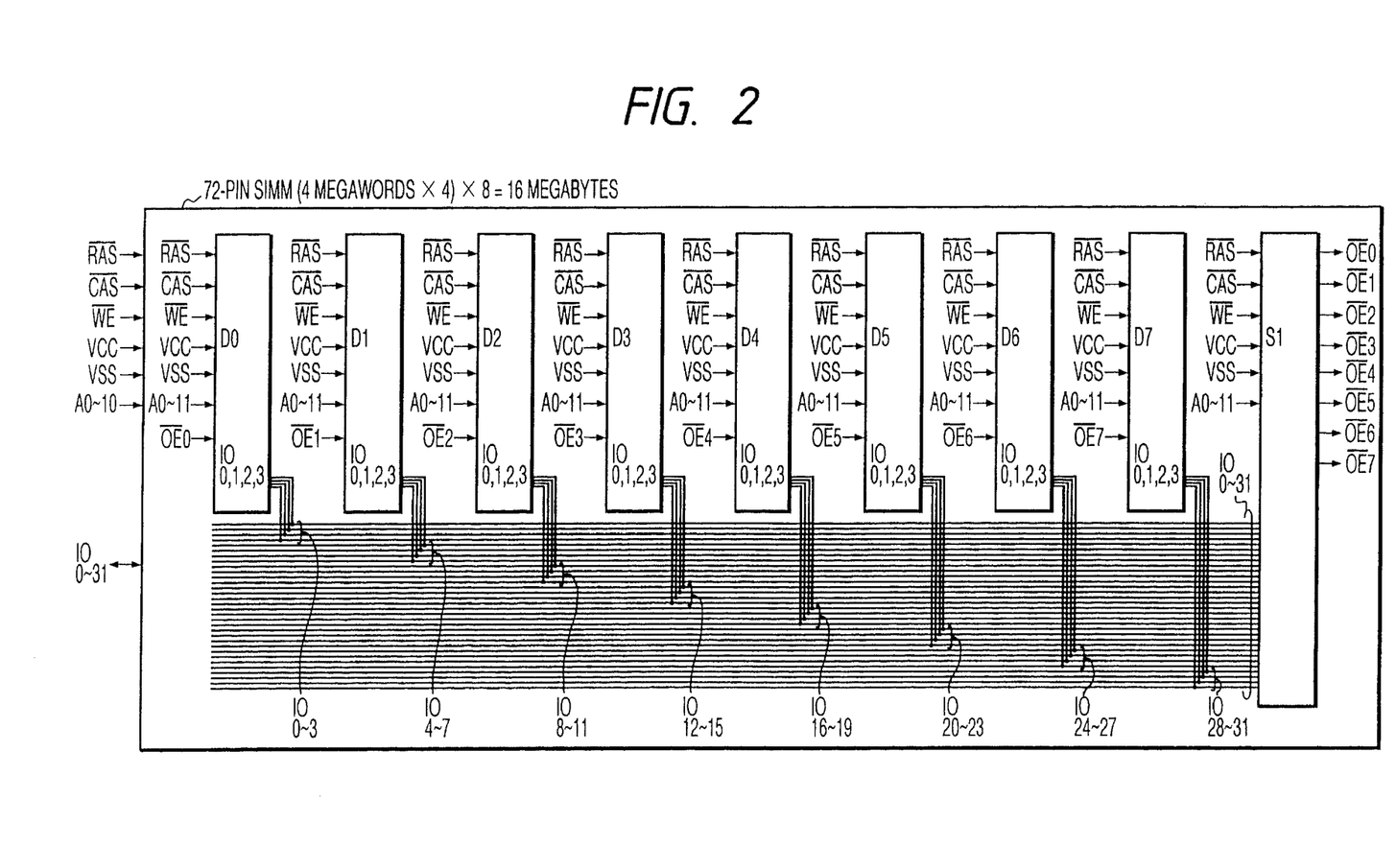
FIG. 2 is a block diagram illustrating a memory module with the defective remedy LSI of FIG. 1 mounted, the memory module being practiced as one preferred embodiment of the invention.

Now, referring to FIG. 2, there is shown a block diagram illustrating a memory module, or a SIMM (Single Inline Memory Module) practiced as one preferred embodiment of the invention, the memory module carrying the defect remedy LSI of FIG. 1. The embodiment of FIG. 2 is a 72-pin SIMM. Namely, the 16 megabytes (about 128 megabits) SIMM is constituted by combining eight dynamic RAMS each being about 4 megawords×4 bits (about 16 megabits) in storage capacity.

The eight dynamic RAMs D0 through D7 are each accessed on a 4-bit basis, totally providing about 16 megabits of storage. Therefore, in a 2K refresh product, an address signal consists of 11 bits of A0 through A10. Namely, each dynamic RAM receives the X address signal of 11 bits and the Y address signal of 11 bits. In a 4K refresh product, each dynamic RAM receives the X address signal of 12 bits and the Y address signal of 10 bits. In addition, there are other possible combinations of the number of bits of the X address and Y address signals. A data bus of the SIMM is 32 bits I/O 0~31. Each of the eight dynamic RAM chips is coupled to a different 4-bit data bus. In total, memory access is made on a 32-bit basis.

The dynamic RAMs D0 through D7 are commonly and in parallel supplied with control signals /RAS, /CAS and /WE entered in the SIMM. The dynamic RAMs are commonly connected to a power supply VCC and a ground VSS. When the eight dynamic RAMs are accessed in parallel, output enable signals /OE0 through /OE7 not used on conventional memory modules are used to mask a read signal coming from a dynamic RAM having a defect to be described.

To implement defect remedy of any dynamic RAM on word line (refresh address) basis in a memory module such as the above-mentioned SIMM, the defect remedy LSI (S1) such as illustrated in FIG. 1 is mounted on the memory module. It should be noted that, in the case of the above-mentioned second defective address writing method, if no dynamic RAM installed is found defective, the defect remedy LSI (S1) is not mounted on the memory module. The defect remedy LSI as the above-mentioned SIMM has a same input interface as that of the dynamic RAM and a data input/output interface corresponding to the data bus of the SIMM. The output enable signals /OE0 through /OE7 formed in the mask portion 8 provided on the defect remedy LSI (S1) are supplied to the output enable pins(terminals)/OE0 through /OE7 of the dynamic RAMs D0 through D7.

A 72-pin connector pole, not shown, for the SIMM is inserted in a slot for a memory board, not shown. The memory board is provided with a plurality of slots for accommodating a plurality of SIMMs as required. Based on the number of SIMMs installed, an information storage capacity of a storage device of a computer system or the like is determined.

Figure 3:
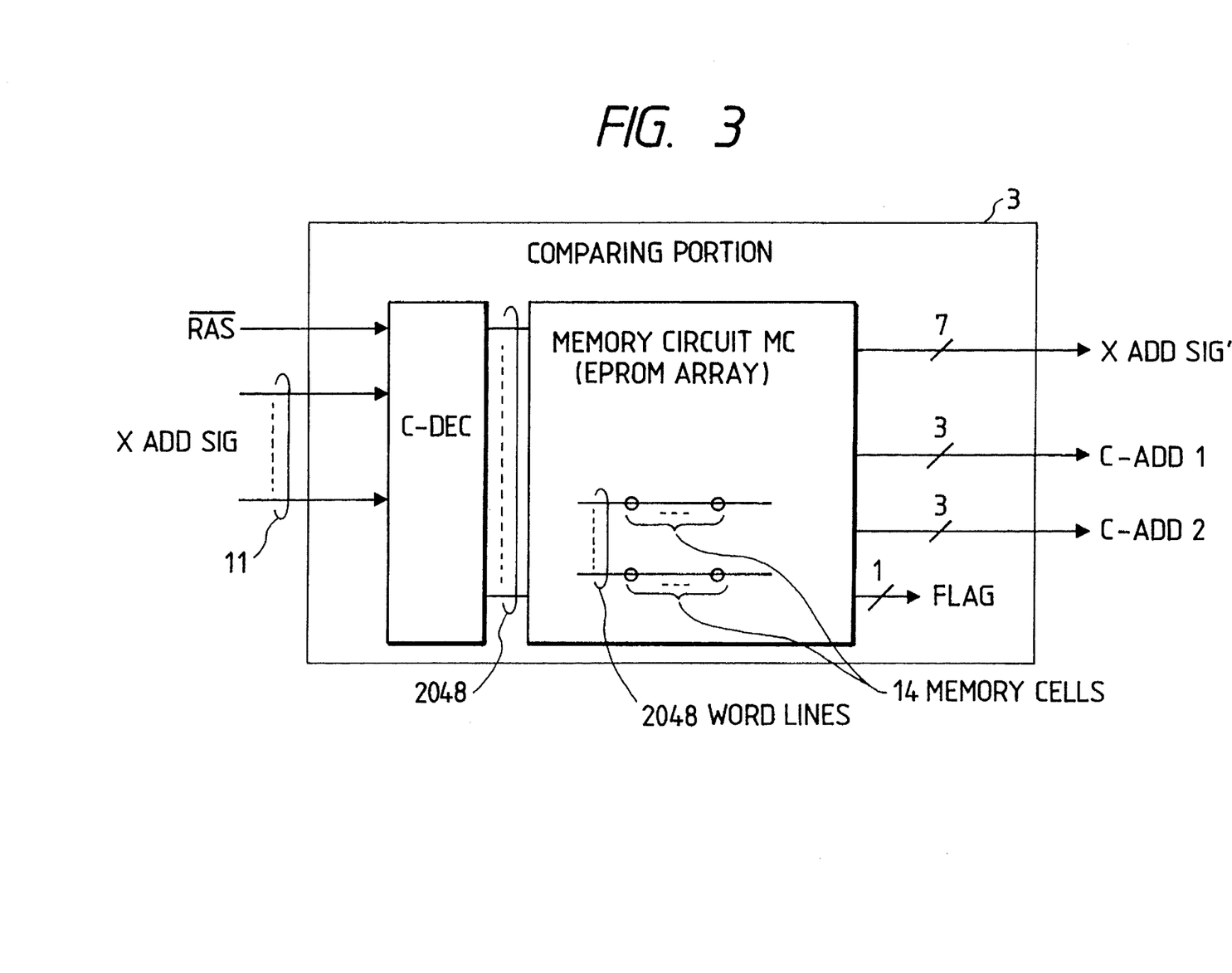
FIG. 3 is a block diagram illustrating a memory circuit constituting a comparing portion of the defect remedy LSI of FIG. 1, the memory circuit being practiced as one preferred embodiment of the invention.

Referring to FIG. 3, there is shown a block diagram illustrating a memory circuit constituting the comparing portion 3 of the above-mentioned defect remedy LSI, the memory circuit being practiced as one preferred embodiment of the invention. In this embodiment, the memory circuit is constituted by an EPROM (Erasable and Programmable Read-Only Memory) array. However, since there is no need for erasing written data by ultraviolet as with an ordinary EPROM, no window for erasure is provided on the defect remedy LSI. Namely, an EPROM array herein denotes that a same memory array as an EPROM is used, in which, unlike an ordinary EPROM, erasure is disabled and therefore writing is permitted only once. In this embodiment, no erasure window is provided because the defect remedy LSI stores data such as defective addresses, erasure of which is not permitted from the viewpoint of secure data retention.

The EPROM array has 2,048 word lines corresponding to the refresh addresses of the dynamic RAM, but not limited thereto. There are 14 data lines as with a conventional constitution.

As will be described, to perform redundancy remedy on 128 word lines of the 2,048 word lines of each dynamic RAM, a 7-bit X address signal "X-add sig$^+$" for the redundancy remedy RAM portion is required. To specify two defective dynamic RAMs of the above-mentioned eight dynamic RAMs at the same time, a 3-bit first defective chip address C-add 1 and a 3-bit second defective chip address C-add 2 are required. In addition, one more bit is required for a remedy flag that determines whether read data has a defective address. Hence, to simultaneously remedy the two defective word lines at the same corresponding addresses of the two dynamic RAMs, 14 (=7+3+3+1) bits of defect data are required. Consequently, it may be that the comparing portion 3 functions also as an address translation (or data conversion) circuit that receives the X address signal "X-add sig" of 11 bits to output defect data of 14 bits corresponding to the "X-add sig". In this case, the capacity of the memory circuit is $2^{11} \times 14 = 28$ kilobits. To perform redundancy remedy on 64 word lines of the total number of 2,048 word lines of the dynamic RAMs, the X address signal "X-add sig$^+$" for redundancy remedy RAM portion of only six bits is required, thereby reducing the number of defect data bits to 13. In this case, the capacity of the memory circuit is $2^{11} \times 13 = 26$ kilobits.

The comparing portion 3 has a comparing portion decoder C-dec that captures the X address signal "X-add sig" to select one of the 2,048 word lines. In this embodiment, a write circuit is provided, not shown. Namely, in the above-mentioned first defective address writing method, to write 14-bit redundancy data to the memory circuit MC, the 14-bit write data is supplied to the internal data line of the EPROM array over a 14-bit write signal line "W data" of FIG. 1 through the input/output portion 7 of FIG. 1. The 14-bit write signal line "W data" is electrically coupled to predetermined 14 bus lines of the first through eighth input/output bus lines I/O 0~31. In a nonvolatile memory device, a high voltage of about 12 V is applied to the word lines and a high voltage of about 10 V is applied to the data lines on which data is written, thereby injecting hot electrons in the vicinity of the drain of the device into the floating gate.

Figure 4:
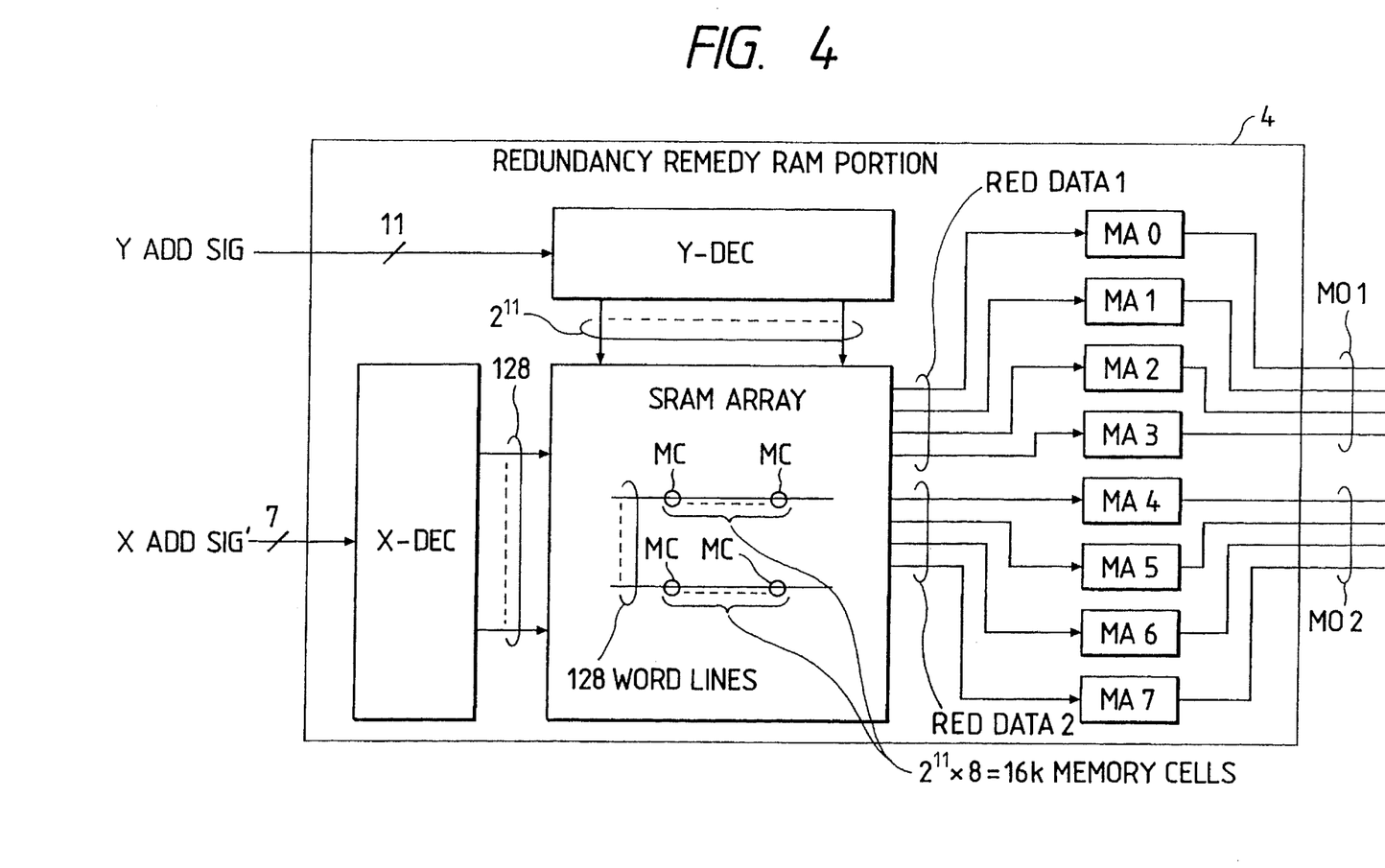
FIG. 4 is a block diagram illustrating a redundancy remedy RAM portion of the defect remedy LSI of FIG. 1, the redundancy remedy RAM portion being practiced as one preferred embodiment of the invention.

Referring to FIG. 4, there is shown a block diagram illustrating the redundancy remedy RAM portion 4 in the above-mentioned defect remedy LSI, the redundancy remedy RAM portion 4 being practiced as one preferred embodiment of the invention. In this embodiment, a static RAM (SRAM) array is provided. If there are two sets of areas to be remedied as mentioned above, two identical SRAM chips are provided.

In the embodiment of FIG. 4, the SRAM array has a maximum of 128 word lines. Each of 128 word lines of the SRAM is connected to 16K ($2^{11}\times 8$) memory cells. Therefore, the storage capacity of the memory cells of the SRAM array is 2 megabits. In practice, if a longer word line results in a longer memory access time, the word line may be divided appropriately to reduce the number of memory cells to be connected to one physical word line.

To shorten the word lines, the memory array may be constituted by four memory mats in the above-mentioned case in which memory access is performed on a 8-bit basis, thereby connecting 4K memory cells to one word line. Also, a word line selector may be arranged in the center of the above-mentioned four memory mats to divide the word lines, thereby connecting 2K memory cells to a pair of word lines. Alternatively, the word lines may be divided into main word lines and local word lines, the local word lines being provided with word line drivers to realize high-speed memory access.

In the above-mentioned redundancy remedy RAM portion 4, eight redundant memory cells are selected by the 7-bit X address signal "X-add sig" and the 11-bit Y address signal "Y-add sig" to output the 4-bit first redundancy remedy data "red data 1" and the 4-bit second redundancy remedy data "red data 2". The first redundancy remedy data are outputted to main amplifiers MA0 through MA3 while the second redundancy remedy data are outputted to main amplifiers MA4 through MA7. The main amplifiers MA0 through MA7 are enabled when the redundancy remedy RAM portion 4 is in the read state. When the redundancy remedy RAM portion 4 is in the write state, data on the first input/output data bus MO1 and the second input/output data bus MO2 are transmitted to a common data line, not shown, of the redundancy remedy RAM portion 4 to be written to the redundant memory cells.

Figure 5:
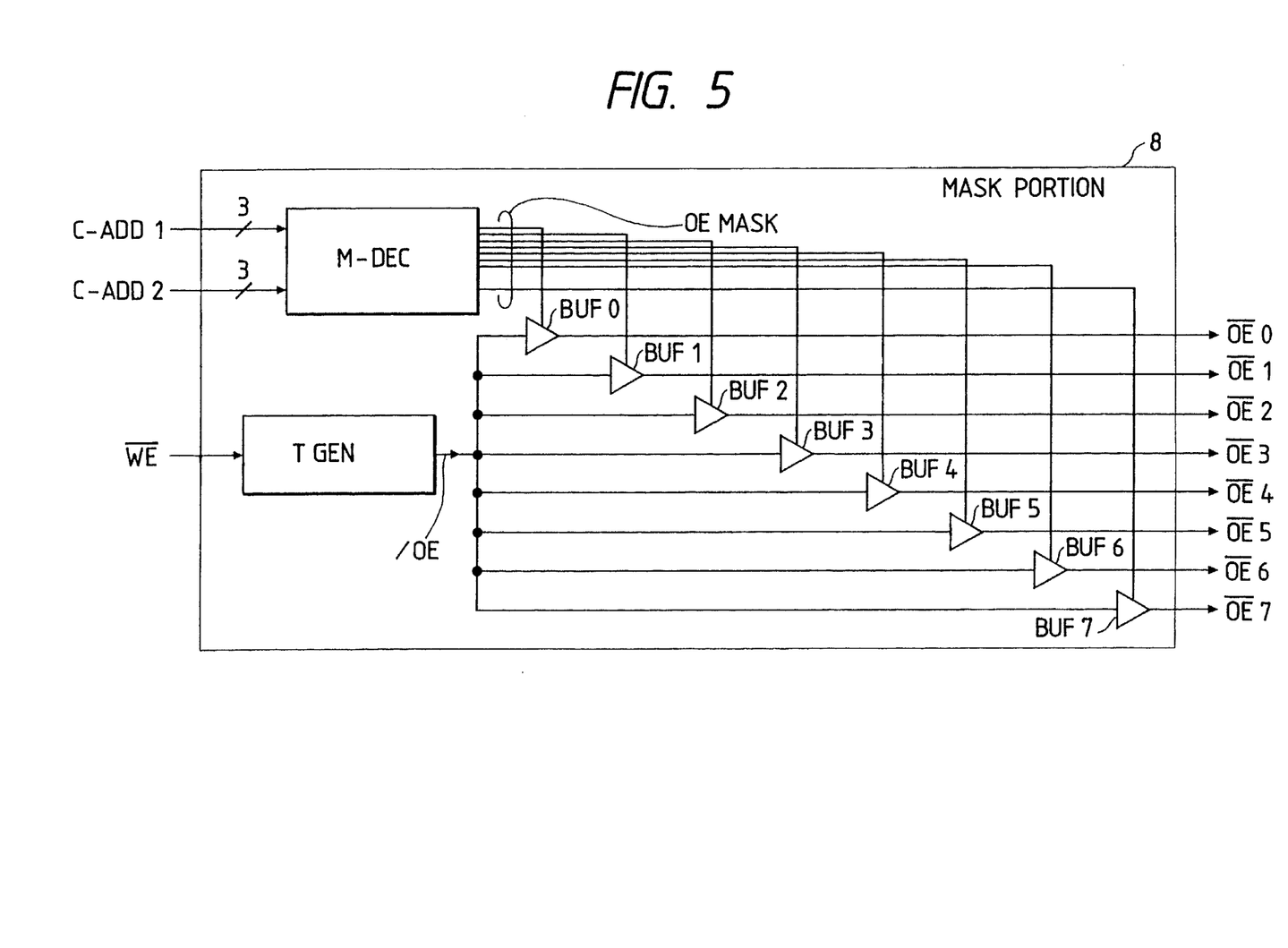
FIG. 5 is a block diagram illustrating a mask portion of the defect remedy LSI of FIG. 1, the mask portion being practiced as one preferred embodiment of the invention.

Referring to FIG. 5, there is shown a block diagram illustrating the mask portion 8 in the above-mentioned defect remedy LSI, the mask portion being practiced as one preferred embodiment of the invention. In the mask portion 8, the 3-bit first chip address C-add 1 and the 3-bit second chip address C-add 2 read from the comparing portion 3 are decoded by a decoder M-dec of the mask portion 8 to in the high level the output enable signal/OEi (i=0~7) corresponding to a dynamic RAM chip remedied by masking the output enable signal /OE formed by a timing generator T GEN based on the write enable signal /WE. The dynamic RAM Di that has captured the above-mentioned high-level output enable signal/OEi puts a corresponding data bus in the high impedance state. Namely, the dynamic RAM Di does not drive the data bus.

Based on the first chip address C-add 1, the mask portion decoder M-dec may put one predetermined output enable signal /OEj (j=0, ..., 7) in the high level and, at the same time, based on the second chip address C-add 2, put another predetermined output enable signal /OEk (k=0, ..., 7) in the high level.

In FIG. 5, the above-mentioned gating function (or mask function) is implemented by a buffer circuit. Namely, output buffers buf0 through buf7 of FIG. 5 provide the gating function and a power amplifying function that fast drives a load capacity composed of a parasitic capacity and the like of printed wirings and the like formed on a mounting substrate constituting the memory module.

The timing generator T GEN captures the write enable signal /WE to make low the output enable signal /OE when the /WE is high (read operation is on). When the /WE is low (write operation is on), the timing generator T GEN holds the output enable signal /OE at the high level, so that the above-mentioned mask function is substantially stopped. Namely, in the write operation, writing is performed on the redundancy remedy RAM portion and, at the same time, on the dynamic RAM having a defective word line. Although the writing having no significance is performed on the defective word line as mentioned above, the writing is ignored in the read operation, presenting no problem in practice. This novel constitution eliminates a special controller otherwise required when stopping the memory access to the dynamic RAM having a defective word line in the write operation, thereby simplifying the circuit.

Figure 6:
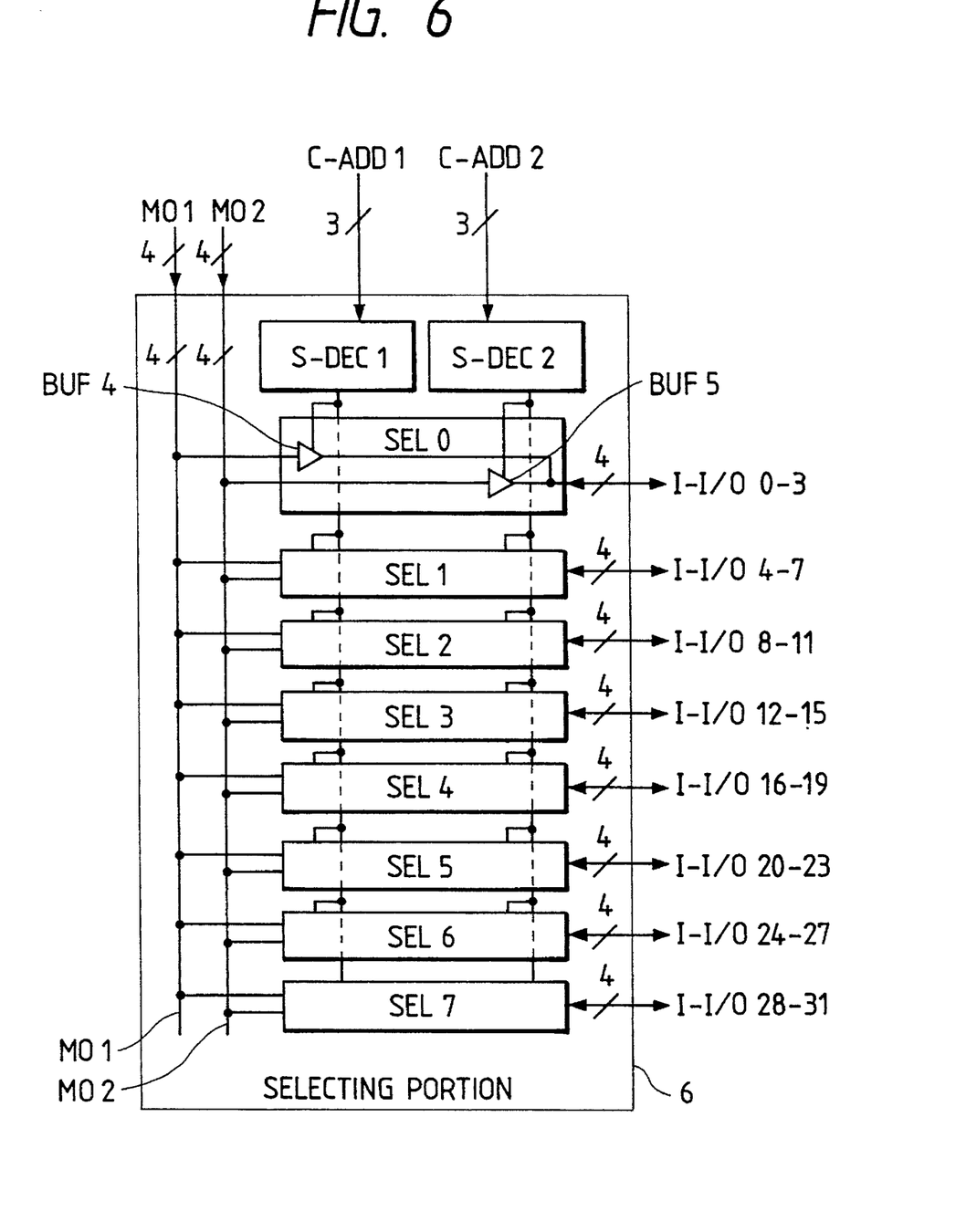
FIG. 6 is a block diagram illustrating a selecting portion of the defect remedy LSI of FIG. 1, the selecting portion being practiced as one preferred embodiment of the invention.

Referring to FIG. 6, there is shown a block diagram illustrating the selecting portion 6 of the above-mentioned defect remedy LSI, the selecting portion 6 being practiced as one preferred embodiment of the invention. The selecting portion 6 makes connection between the first and second input/output data buses MO1 and MO2 and the input/output portion 7 of FIG. 1.

The selecting portion 6 includes a first selector decoder S-dec 1 for receiving the first defective chip address C-add 1, a second selector decoder S-dec 2 for receiving the second defective chip address C-add 2, a first selecting circuit (first unit selecting circuit) SEL0 and a second through eighth selecting circuits SEL1~SEL7 coupled between the first input/output data bus MO1 and the second input/output data bus MO2 and the first internal data bus I-I/O 0~3. Each of the second through eighth selecting circuits SEL1~SEL7 is coupled between the first and second input/output data buses MO1 and MO2 and a corresponding data bus of the second internal data bus I-I/O 4~7 through the eighth internal data bus I-I/O 28~31. The first selecting circuit is the same as the eighth selecting circuit in circuit configuration.

The first selecting circuit SEL0 comprises the output buffer buf4 having an input pin coupled to the first input/output data bus MO1, an output pin coupled to the first internal data bus I-I/O 0~3 and a control pin coupled to the first selector decoder S-dec 1, and the output buffer buf5 having an input pin coupled to the second input/output data bus MO2, an output pin coupled to the second internal data bus I-I/O 0~3 and a control pin coupled to the second selector decoder S-dec 2. Although not shown, each of the second through eighth selecting circuits also has two output buffers like the first selecting circuit SEL1. The first selector decoder S-dec 1 controls each of the selecting circuit SEL0 through SEL7 to supply data on the first input/output data bus MO1 to predetermined one of the first through eighth internal data buses. The second selector decoder S-dec 2 controls each of the selecting circuits SEL0 through SEL7 to supply data on the second input/output data bus MO2 to predetermined one of the first through eighth internal data buses. Therefore, this setup allows the first input/output data bus MO1 and the second input/output data bus MO2 to be coupled to two different internal data buses simultaneously. Further, the data on only one of the first and second input/output data buses MO1 and MO2 may be supplied to an internal data bus and the data on both the MO1 and MO2 may not be supplied to any internal data bus.

The output buffers of each selecting circuit are each formed by a circuit having the 3-state output capability like a clocked inverter or the like. In FIG. 6, the output signal transmission path is illustratively depicted. The present embodiment is also provided with a circuit for performing signal transmission in the opposite direction for writing operation. It should be noted that, if a CMOS (Complementary Metal-Oxide Semiconductor) transfer gate circuit is used, one selecting circuit may transmit signals bidirectionally.

Figure 7:
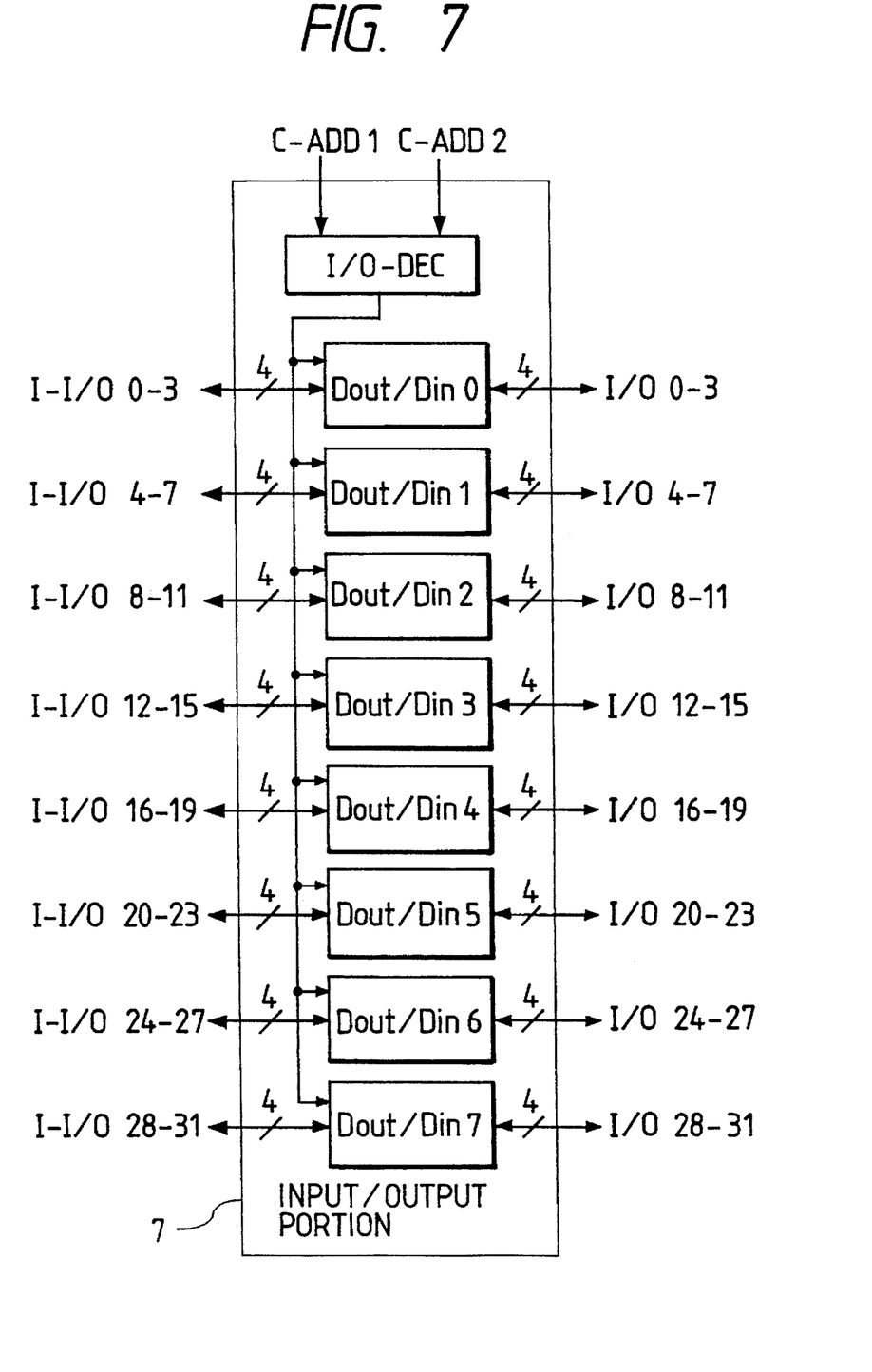
FIG. 7 is a block diagram illustrating an input/output portion of the defect remedy LSI of FIG. 1, the input/output portion being practiced as one preferred embodiment of the invention.

Referring to FIG. 7, there is shown a block diagram illustrating the input/output portion 7 of the above-mentioned defect remedy LSI, the input/output portion 7 being practiced as one preferred embodiment of the invention. The input/output portion 7 is composed of eight input/output circuits Dout/Din 0–7, each performing an input/output operation on a 4-bit basis in correspondence with the above-mentioned dynamic RAMs D0 through D7. If there is one defective word line, the input/output circuit corresponding to the data bus connected with the input/output pin of the dynamic RAM having the defective word line is connected to the corresponding internal data bus. If there are two defective word lines at the same X addresses in two dynamic RAMs, two input/output circuits corresponding to the data buses connected with the input/output pines of the two dynamic RAMs are connected to the corresponding internal data buses respectively.

Because a defective chip address coming from the memory circuit MC constituting the comparing portion 3 is supplied to a decoder I/O-dec of the input/output portion 7, a corresponding input/output circuit is activated to cause the redundancy remedy RAM chip, instead of the dynamic RAM chip having a defective word line, to perform memory access. The decoder I/O-dec has two decoding circuits corresponding to two remedy areas and output an OR signal. Consequently, if there are two areas to be remedied, the two input/output circuits Dout/Din(i) corresponding to the two dynamic RAM chips having defective word lines are activated simultaneously.

When writing data to the memory circuit MC constituting the comparing portion 3, four of the eight input/output circuits Dout/Din are activated simultaneously because the data is written in units of 14 bits. The decoder I/O-dec also provides a capability for simultaneously activating the above-mentioned four input/output circuits Dout/Din in the write mode.

The defect remedy LSI of FIG. 1 remedies defective word lines at only X addresses by using the fact that the dynamic RAM memory access is performed through time division of an X address signal and a Y address signal. Namely, decision of remedying a defective word line is started by entering an X address, followed by entering of a Y address with a delay; by using this timing, a time required for the decision is adjusted. This setup permits remedy of a defective word line detected on the memory module without sacrificing a substantial memory cycle.

The redundancy remedy RAM portion 4 is embodied by a static RAM permitting high-seed reading for example. Consequently, a refresh operation for a remedied word line is not required. This makes it unnecessary to consider refreshing, thereby enhancing ease of use the defect remedy LSI significantly. However, the redundancy remedy RAM portion 4 may also be constituted by any of nonvolatile memories including EPROM, EEPROM, flash memory and FRAM. Further, a dynamic RAM is also available.

In the defect remedy LSI, a defective word line is remedied by writing appropriate data to the nonvolatile memory circuit. This gives generality of use to the defect remedy LSI when the memory module is of 8-bit or 16-bit type. Namely, constituting the redundancy remedy RAM portion 4 by combining the number of X address bits and Y address bits and preparing the input/output portion 7 in types matching the number of input/output bits of the applicable dynamic RAM allow the defect remedy LSI to be applied to a variety of memory modules constituted by corresponding dynamic RAMs.

As described above, the defect remedy LSI chip of FIG. 1 may remedy 128 ($2^7$) different defect address signals for example and, at the same time, remedy two dynamic RAM chips for each defect address signal. However, the remedy is not limited thereto. For example, only one dynamic RAM chip may be remedied for each defect address signal. In this case, if the storage capacity of an SRAM array of the redundancy remedy RAM portion is $2^7 \times 2^{11} \times 8 = 2$ megabits (7 bits of the X address for the redundancy remedy RAM portion, 11 bits of Y address, and 8 bits of redundancy remedy data) like the embodiment of FIG. 1, the number of bits of the X address signal "X-add sig$^+$" for the redundancy remedy RAM portion may be set to 8. Namely, the SRAM array is constituted as $2^8 \times 2^{11} \times 4 = 2$ megabits (8 bits of X address for the redundancy remedy RAM portion, 11 bits of Y address, and 4 bits of redundancy remedy data). Accordingly, the second input/output data bus MO2 becomes unnecessary and in turn the second selector decoder S-dec 2 in the selecting portion 6 becomes unnecessary. Further, remedy may be made for 256 ($2^8$) different defect address signals and one dynamic RAM chip may be remedied for each defect address signal. If probability is low in which defects occur on two dynamic RAMs at the same X addresses, the output data (redundancy remedy data) of the SRAM array may be set to four bits (each bit corresponding to one dynamic RAM) as mentioned above to increase the number of defect address signals to be remedied by four if the capacity of the SRAM is the same as that of the SRAM array of FIG. 1. The capacity of the memory circuit MC when remedying one dynamic RAM for each defect address signal is $2^{11} \times (8+3+1) = 2^{11} \times 12 = 24$ kilobits because the X address for redundancy remedy RAM portion is 8 bits wide and the second chip address C-add 2 becomes unnecessary.

The defect remedy LSI of FIG. 1 is described with the dynamic RAM being a so-called 2K refresh product, for example, the dynamic RAM not being limited thereto. For example, the defect remedy LSI may also remedy a defect on a dynamic RAM called 4K refresh product. In this case, because the X address is 12 bits and the Y address is 10 bits wide, the capacities of the memory circuit MC and the SRAM array are different from those of FIG. 1. Namely, the capacity of the memory circuit MC is $2^{12} \cdot 14 = 56$ kilobits and the capacity of the SRAM array is $2^7 \times 2^{10} \times 8 = 1$ megabits.

Further, the defect remedy LSI may simultaneously remedy two dynamic RAM for a defect address and one dynamic RAM for another defect address. To be specific, when the defect remedy LSI remedies a 2K refresh dynamic RAM of 16M (×4), not shown, the SRAM array is divided into a first divided array and a second divided array, each of the divided arrays having a capacity of $2^6 \times 2^{11}$ (2048)×4= 512 kilobits if the X address for the redundancy remedy RAM portion is 6 bits, the Y address is 11 bits, and the redundancy remedy data is 4 bits wide. The memory circuit MC has a capacity of $2^{11}$ (2048)×(6+6+1+1+3+3)=40 kilobits if the X address is 11 bits, the X address for the first divided array is 6 bits, the X address for the second divided array is 6 bits, a first redundancy flag for indicating whether to access the first divided array is 1 bit, a second redundancy flag for indicating whether to access the second divided array is 1 bit, the first defective chip address is 3 bits, and the second defective chip address is 3 bits wide. The first divided array is accessed by the X address of 6 bits for the first divided array and the Y address of 11 bits to output first redundancy remedy data of 4 bits. The second divided array is accessed by the X address of 6 bits for the second divided array and the Y address of 11 bits to output second redundancy remedy data of 4 bits. When remedying two dynamic RAMs simultaneously, the first and second divided arrays receive the same or different X addresses for the first and second divided arrays to output the first and second redundancy remedy data of 4 bits each respectively. When remedying one dynamic RAM, only the X address for one of the first and second divided array is outputted from the memory circuit MC (or only the X address for one of the first and second divided arrays is made valid) to output the 4-bit redundancy remedy data from only one of the first and second divided arrays. Constituting the defect remedy LSI as mentioned above permits efficient remedy of more defect addresses with a smaller storage capacity than those of the defect remedy LSI of FIG. 1.

Referring to FIGS. 1 and 3, the memory circuit MC outputs the 1-bit remedy flag. The memory circuit MC may also output a 1-bit first remedy flag corresponding to the first defective chip address C-add 1 and a 1-bit second remedy flag corresponding to the second defective chip address C-add 2. In this case, the storage capacity of the memory circuit MC is $2^{11} \times (15) = 30$ kilobits. When the memory circuit MC is constituted so as to output the first and second remedy flags as mentioned above, any portions of the redundancy remedy RAM portion 4, the selecting portion 6, the mask portion 8, and the input/output portion 7 that need not be operated may be controlled for stop or the like operations, thereby reducing the power consumption of the defect remedy LSI.

The following advantages are obtained from the above-mentioned preferred embodiments of the invention:

(1) A semiconductor memory system having a defect remedy large-scale integrated circuit, the large-scale integrated circuit comprising: an input interface portion for capturing address and control signals, the input interface portion being the same as that of a dynamic RAM; an input/output interface portion corresponding to a data bus of a memory device comprised of a plurality of dynamic random access memories; a memory circuit to which a chip address and an X defective address of any of the plurality of random access memories are electrically written, the memory circuit being substantially made nonvolatile; a redundancy remedy RAM portion composed of a static RAM wherein a word line is selected by a compare match signal between an X address signal and the defective address of the memory circuit, the X address signal and the defective address being captured via the input interface portion, and a column is selected by a Y address signal captured via the input interface portion; a selecting portion for connecting a data input/output bus of the redundancy remedy RAM portion to an input/output circuit corresponding to a defective chip address; a data input/output portion for selectively activating an input/output circuit to be connected to a data bus corresponding to a dynamic RAM found defective; and a mask portion for outputting a control signal for putting in a high-impedance state an output pin of the defective RAM in a read operation. According to this novel setup, mounting the above-mentioned defect remedy LSI chip on the memory module may remedy a defect caused on a word line basis in a dynamic RAM of the memory module by replacing the defective word line with the corresponding word line in the redundancy RAM internal to the defect remedy LSI chip.

(2) The above-mentioned defect remedy LSI remedies a defect caused in a reliability test such as a burn-in test without involving characteristics deterioration of the memory module, thereby enhancing a substantial product yield.

(3) A semiconductor memory system wherein the memory circuit is composed of a nonvolatile memory circuit accessed by an X address, the nonvolatile memory circuit being written with an address of a chip having a defect, a remedy flag bit, and an X address of the redundancy remedy RAM portion, the remedy flag bit being valid and invalid indicating match and mismatch with the defective address respectively. As a result, the number of redundancy sets may be increased with a simple construction.

(4) A semiconductor memory system wherein the mask portion forms an output enable signal from the chip address of the defective dynamic RAM to put the defective dynamic RAM in an output high-impedance state. This simple constitution may isolate the defective dynamic RAM.

(5) A plurality of remedy areas are set to the memory circuit for the same X address, thereby enhancing a remedy ratio while effectively utilizing the input/output circuit.

(6) Installing the above-mentioned defect remedy LSI on the memory module remedies a defect caused in a reliability test such as a burn-in test without involving characteristics deterioration of the memory module, enhancing a substantial product yield and, at the same time, remedies a defect caused after assembly on the memory module, enhancing the substantial reliability of the memory module.

While the preferred embodiments of the present invention have been described using specific terms, such description is for illustrative purposes only, and it is to be understood that changes and variations may be made without departing from the spirit or scope of the appended claims. For example, the above-mentioned comparing portion may be provided with a nonvolatile memory circuit based on a fuse or the like for storing a defective address and a plurality of digital compactors composed of logic circuits for comparing the information stored in the nonvolatile memory circuit with an entered X address in order to select a word line in the redundancy remedy RAM portion. Namely, when the number of redundancy sets is relatively smaller, substantial circuit simplification is achieved as compared with a memory module based on EPROM or the like. In addition to using the hot electron as with the EPROM, writing to a nonvolatile memory device may be made by using a tunnel current in a thin tunnel insulation film provided between a floating gate and a diffusion layer such as a drain.

When a scale to be remedied is relatively small or it takes time to read redundancy data from an EPROM after entering an X address signal, data from a nonvolatile memory circuit such as the EPROM may all be transferred to a high-speed memory such as a static RAM or a register after the memory module is powered on. Then, when accessing the memory module, the static RAM is read as mentioned above or the redundancy data (defective X address) held in the register may be compared by the comparator with the entered X address to determine whether there is a defect to be remedied.

The memory circuit as a comparing portion may be one that uses a static RAM rather than an EPROM as mentioned above. In this case, the memory module may be made nonvolatile by installing a backup battery on the memory module; alternatively, a self test may be performed by an incorporated testing circuit at the time of power-on or command entry or a memory test may be made from a host system to self-remedy a defective chip or a defective X address. Thus, the memory module becomes substantially free of error as a memory system, thereby achieving ultra-high reliability.

The dynamic RAM may be of a synchronous type. In this case, the input interface of the defect remedy LSI is constituted according to the synchronous dynamic RAM.

The present invention is widely applicable to a LSI chip for remedying defects detected on dynamic RAMs and a memory module using the defect remedy LSI chip.

What is claimed is:

1. A semiconductor memory system having a defect remedy large-scale integrated circuit, said large-scale integrated circuit comprising:

an input interface portion for capturing address and control signals, said input interface portion being the same as that of a dynamic random access memory;

an input/output interface portion corresponding to a data bus of a memory device comprised of a plurality of dynamic random access memories;

a memory circuit to which a chip address and an X defective address of any of the plurality of dynamic random access memories are electrically written, said memory circuit being substantially made nonvolatile;

a redundancy remedy random access memory portion comprising a static random access memory wherein a word line is selected by a compare match signal between an X address signal and the defective address of said memory circuit, the X address signal and the defective address being captured via said input interface portion, and a column is selected by a Y address signal captured via said input interface portion;

a selecting portion for connecting a data input/output bus of said redundancy remedy random access memory portion to an input/output circuit corresponding to a defective chip address;

a data input/output portion for selectively activating an input/output circuit to be connected to a data bus corresponding to a dynamic random access memory found defective; and a mask portion for outputting a control signal for putting in a high-impedance state an output pin of the defective dynamic random access memory in a read operation.

2. A semiconductor memory system according to claim 1 wherein said memory circuit is composed of a nonvolatile memory circuit accessed by an X address, said nonvolatile memory circuit being written with an address of a chip having a defect, a remedy flag bit, and an X address of said redundancy remedy random access memory portion, said remedy flag bit being valid and invalid indicating match and mismatch with the defective address respectively.

3. A semiconductor memory system according to claim 2 wherein said mask portion forms an output enable signal from the chip address of the defective dynamic random access memory to put said defective dynamic random access memory in an output high-impedance state.

4. A semiconductor memory system according to claim 3 wherein a plurality of remedy areas are set to said memory circuit for a same X address signal.

5. A semiconductor memory system comprising a defect remedy large-scale integrated circuit, said semiconductor memory system being formed by a module of a plurality of dynamic random access memories mounted on a mounting substrate, comprising:

an input interface portion for capturing address and control signals, said input interface portion being the same as that of a dynamic random access memory;

an input/output interface portion corresponding to a data bus formed by connecting data input/output pins of said plurality of dynamic random access memories;

a memory circuit to which a chip address and an X defective address of any of the plurality of random access memories are electrically written, said memory circuit being substantially made nonvolatile;

a redundancy remedy random access memory portion composed of a static random access memory wherein a word line is selected by a compare match signal between an X address signal and the defective address of said memory circuit, the X address signal and the defective address being captured via said input interface portion, and a column is selected by a Y address signal captured via said input interface portion;

a selecting portion for connecting a data input/output bus of said redundancy remedy random access memory portion to an input/output circuit corresponding to a defective chip address;

a data input/output portion for selectively activating an input/output circuit to be connected to a data bus corresponding to a dynamic random access memory found defective; and a mask portion for outputting a control signal for putting in a high-impedance state an output pin of the defective dynamic random access memory in a read operation.

6. A semiconductor memory system comprising:

(1) a first data bus including a plurality of first data lines;

(2) a second data bus including a plurality of second data lines;

(3) a plurality of address lines for transmitting a plurality of address signals;

(4) a first control line;

(5) a second control line;

(6) a first memory chip comprising:
 (a) a plurality of first data input/output terminals coupled to each of said plurality of first data lines included in said first data bus;
 (b) a plurality of first address input terminals coupled to each of said plurality of address lines; and
 (c) a first control terminal coupled to said first control line, (7) a second memory chip comprising:
 (a) a plurality of second data input/output terminals coupled to each of said plurality of second data lines included in said second data bus;
 (b) a plurality of second address input terminals coupled to each of said plurality of address lines; and (c) a second control terminal coupled to said second control line, and (8) a redundancy memory chip comprising:
(a) a plurality of first redundancy data input/output terminals coupled to each of said plurality of first data lines included in said first data bus;
(b) a plurality of second redundancy data input/output terminals coupled to each of said plurality of second data lines included in said second data bus;
(c) a plurality of redundancy address input terminals coupled to each of said plurality of address lines;
(d) a first redundancy control terminal coupled to said first control line; and
(e) a second redundancy control terminal coupled to said second control line, wherein said redundancy memory chip outputs first data to be outputted by said first memory chip to said first data bus according to said plurality of address signals and outputs a first control signal to said first control line in the case when said first memory chip is remedied, wherein said redundancy memory chip outputs second data to be outputted by said second memory chip to said second data bus according to said plurality of address signals and outputs a second control signal to said second control line in the case when said second memory chip is remedied, wherein said first memory chip does not output said first data corresponding to said plurality of address signals to said first data bus in the case when said first memory chip receives said first control signal, and wherein said second memory chip does not output said second data corresponding to said plurality of address signals to said second data bus in the case when said second memory chip receives said second control signal.

7. A semiconductor memory system according to claim 6 wherein said first memory chip and said second memory chip are a dynamic random access memory each.

8. A semiconductor memory system according to claim 6 wherein said first memory chip sets said first data input/output terminal in high-impedance state in the case when said first memory chip receives said first control signal and said second memory chip sets said second data input/output terminal in high-impedance state in the case when said second memory chip receives said second control signal.

* * * * *